United States Patent [19]

Marrable, Jr.

[11] Patent Number: 5,621,530
[45] Date of Patent: Apr. 15, 1997

[54] APPARATUS AND METHOD FOR VERIFYING THE COPLANARITY OF A BALL GRID ARRAY

[75] Inventor: Walter E. Marrable, Jr., Gunter, Tex.

[73] Assignee: Texas Instruments Incorporated, Dallas, Tex.

[21] Appl. No.: 429,377

[22] Filed: Apr. 26, 1995

[51] Int. Cl.$^6$ .................................................. G01B 11/00
[52] U.S. Cl. ........................... 356/394; 356/237; 348/126
[58] Field of Search ..................................... 356/394, 398, 356/376, 375, 371, 237; 348/87, 126

[56] References Cited

U.S. PATENT DOCUMENTS 5,015,096  5/1991  Kowalski et al. ...................... 356/124
5,450,206  9/1995  Caillat et al. ........................... 356/237
5,465,152  11/1995  Bilodeau et al. ....................... 356/371

Primary Examiner—Hoa Q. Pham
Attorney, Agent, or Firm—Alan K. Stewart; Wade James Brady, III; Richard L. Donaldson

[57] ABSTRACT

The apparatus (10) includes a flat transparent surface (30) and two angled mirrored surfaces (32, 34) which direct the light to the ball grid array (12) on the underside of the semiconductor device (14) positioned on the flat transparent surface (30) in a live bug mode. The mirrored surfaces (32, 34) also direct the image of the ball grid array (12) to an image capturer (18) such as a video camera. The focus information of each solder ball is used to determine the distance to the tips of each solder ball. The coplanarity of the ball grid array can then be determined and/or verified.

13 Claims, 3 Drawing Sheets

APPARATUS AND METHOD FOR VERIFYING THE COPLANARITY OF A BALL GRID ARRAY

TECHNICAL FIELD OF THE INVENTION

This invention relates in general to the field of semiconductor devices. More particularly, the present invention relates to apparatus and method for verifying the coplanarity of a ball grid array (BGA) on a semiconductor device.

BACKGROUND OF THE INVENTION

Surface mount technology has made it possible to densely populate both sides of a circuit board with semiconductor devices. Because leads of a surface mount integrated circuit (IC) package may be placed closer together than through-hole pins of a dual-in-line package (DIP), the component size of surface mount ICs has also shrunken down. These small packages have been termed small-outline IC packages and chip carriers. Chip carriers are typically used in applications that require large lead counts and employ a variety of mounting techniques, such as flatpacks, quad flatpacks (QFPs), J-leads, Gull-wing leads, leadless, and the more recently developed ball grid arrays (BGAs).

The ball grid array mounting technique uses rows and columns of closely positioned solder balls located on one side of the package as the outer leads of the integrated circuit. Ball grid array packages offer many advantages, including lower yield loss from bent leads and misregistration, higher throughput from greater placement tolerances and a more repeatable assembly process. However, a major concern with the ball grid array package is non-coplanarity of the solder balls which may translate to defective solder joints.

Non-coplanarity may be primarily due to two defects, solder ball non-uniformity or package warpage. When the tips of the solder balls are not coplanar or lie on a flat plane, the resultant lead solder joints may be weak or defective. Therefore, the ability to inspect and verify the ball grid array for non-planarity is crucial. However, because the solder balls are arranged in rows and columns, the profiles of the solder balls located behind the outer rows and columns are not visible.

The ball grid array package has heretofore been inspected in what the industry has termed the "dead bug mode", where the ball grid array faces up. When examined in the dead bug mode, the distance from a reference point to the tip of each solder ball may be measured. Then with a three-point algorithm, a theoretical three-point plane that the ball tips lie in may be computed. Using this theoretical plane, it is determined whether all the ball tips fall into this plane. However, the computation of the theoretical plane does not take into account the weight distribution of the device. Therefore, the actual weight distribution of the device may cause it to rest on a different set of ball tips than the ones used to compute the theoretical plane. The result is an inaccurate estimate of which solder balls will actually support the weight of the device and an erroneous determination of the coplanarity of the ball grid array.

SUMMARY OF THE INVENTION

It may be seen from the foregoing that a need has arisen for apparatus and a method for verifying the coplanarity of a ball grid array, which takes into account of the actual weight distribution of the semiconductor device.

In accordance with the present invention, the apparatus and method are provided which eliminates or substantially reduces the disadvantages associated with prior methods.

In one aspect of the invention, the apparatus includes a flat transparent surface and two angled mirrored surfaces which directs the light to the ball grid array on the underside of the semiconductor device positioned on the flat transparent surface in a live bug mode. The mirrored surfaces also directs the image of the ball grid array to an image capturer such as a video camera. The focus information of each solder ball is used to determine the distance to the tips of each solder ball. The coplanarity of the ball grid array can then be determined and/or verified.

In another aspect of the invention, a method for verifying the coplanarity of a ball grid array having a plurality of solder balls on the underside of a semiconductor device package is provided. The steps include positioning the semiconductor device with the ball grid array down on a flat transparent surface, viewing the ball grid array through the flat transparent surface, and measuring the distance from a predetermined reference point to the tip of each solder ball. The coplanarity of the solder balls may then be determined from the measured distances of the plurality of solder balls.

In yet another aspect of the invention, a set of no less than three reference plane datums are provided to establish a reference plane for solder ball height measurement. By focusing on the reference plane datums, alignment of the image capturer with respect to the transparent surface on which the semiconductor device is positioned in live bug mode is achieved and verified.

In yet another aspect of the invention, a golden unit having known physical dimensions is provided to verify the accuracy of the apparatus. The golden unit has a solder ball formation that includes a single row of solder balls positioned along the periphery of the golden unit. All solder balls are therefore visible when viewed from the side and can be measured in live bug mode by conventional means. The known ball height can then be used to verify the measurements obtained by the teachings of the present invention.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–7 of the drawings, like numerals being used for like and corresponding parts of the various drawings.

Figure 1:
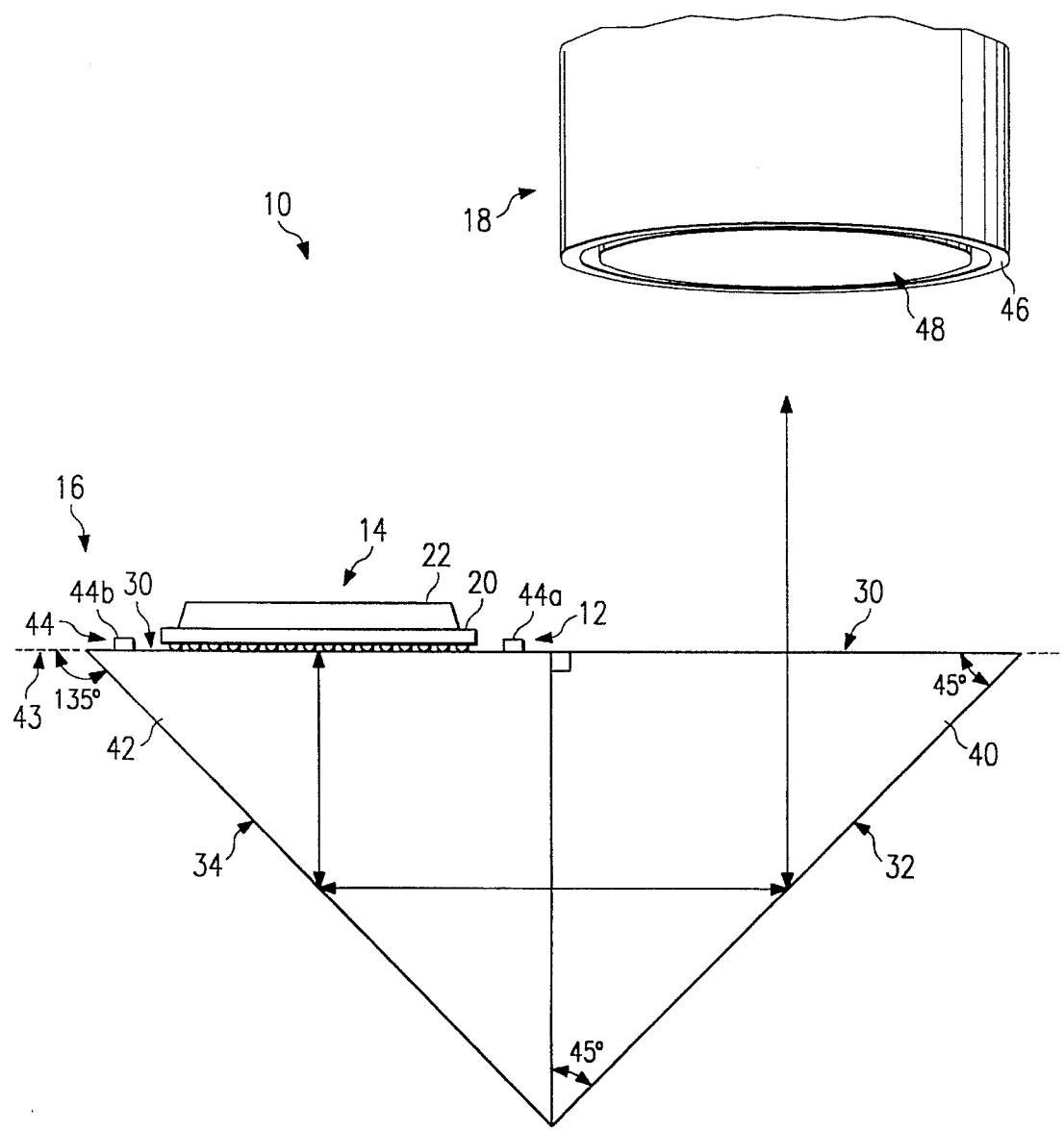
FIG. 1 is a simplified diagram of an embodiment of the apparatus and method for verifying ball grid array coplanarity in accordance with the teachings of the invention.

Referring to FIG. 1, apparatus 10 for verifying the coplanarity of a ball grid array (BGA) 12 on a semiconductor device 14 in accordance with the teachings of the present invention is shown. The semiconductor device 14 is positioned, in a live bug mode or balls down, on an optical assembly or a light and image director 16, which directs light from a light source/image capturer 18 to the underside of the semiconductor device 14 where the ball grid array 12 resides. The image of the ball grid array 12 is returned via substantially the same route by the optical assembly 16 to the image capturer 48. In this manner, a view of the ball grid array 12 as the device 14 is exerting its weight on the array 12 can be captured. Because the ball grid array 12 is positioned in a live bug mode, the way the device 14 sits on the ball grid array 12 as affected by the center of gravity and weight distribution can be viewed to determine true coplanarity.

In detail, the semiconductor device 14 typically includes a die that is encapsulated in a plastic or ceramic package 22, which is attached to a substrate 20. A plurality of solder balls 12 are deposited in a grid-like manner on the underside of the substrate 20. The device 14 is placed ball-grid-array-down on a transparent or generally transparent surface 30 of the optical assembly 16. Below the transparent surface 30 are two mirrored surfaces 32 and 34 placed at approximately 45° and 135° to the transparent surface 30, respectively, as shown in FIG. 1. The mirrored surface 32 reflect light from the light source 46, which may be positioned above the device 14, to the other mirrored surface 34, and then up to illuminate the ball grid array 12 behind the transparent surface 30. The image of the illuminated ball grid array 12 is then reflected by the mirrored surfaces 34 and 32 back up to the image capturer 48.

Figure 2:
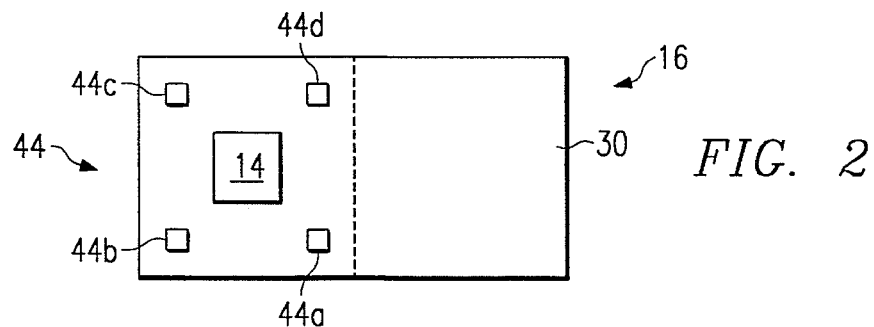
FIG. 2 is a top view of the embodiment of the apparatus and method.

Referring also to FIG. 2, it may be seen that a reference plane 44 upon which the ball tips are resting against can be established by using three or more reference plane datums 44a–d. These are small objects preferably having a flat reflective bottom surface positioned on the transparent surface 30 around the semiconductor device 14. Because the semiconductor device 14 is in the live bug mode, the reference plane 44 coincides with the actual plane the device is resting on or the transparent surface 30. The reference plane datums 44a–d may be positioned on the top surface of the image director 16 each time the apparatus is set up, or they may be semi-permanently or permanently fixed to the transparent surface 30. The reference plane datums 44a–d are used to perpendicularly align the image capturer 48 to the reference plane 43 as described in more detail below.

In practice, the optical assembly 16 may be constructed from a sheet of transparent glass, mirrors, and other similar optical materials or devices. Alternatively, two prisms 40 and 42 with transparent sides 30 and mirrored sides 32 and 34 may be used. It is important to note that the optical assembly or light and image director 16 includes any optical device that enables a head-on view of the ball grid array 12 as it supports the natural weight distribution of the semiconductor device 14. The light source/image capturer 18 may be implemented by a ring light 46 encircling a camera lens 48 coupled to a still-image or video camera. Alternatively, the light source, the lens and the camera may be disjointedly located about the optical assembly 16.

Figure 3:
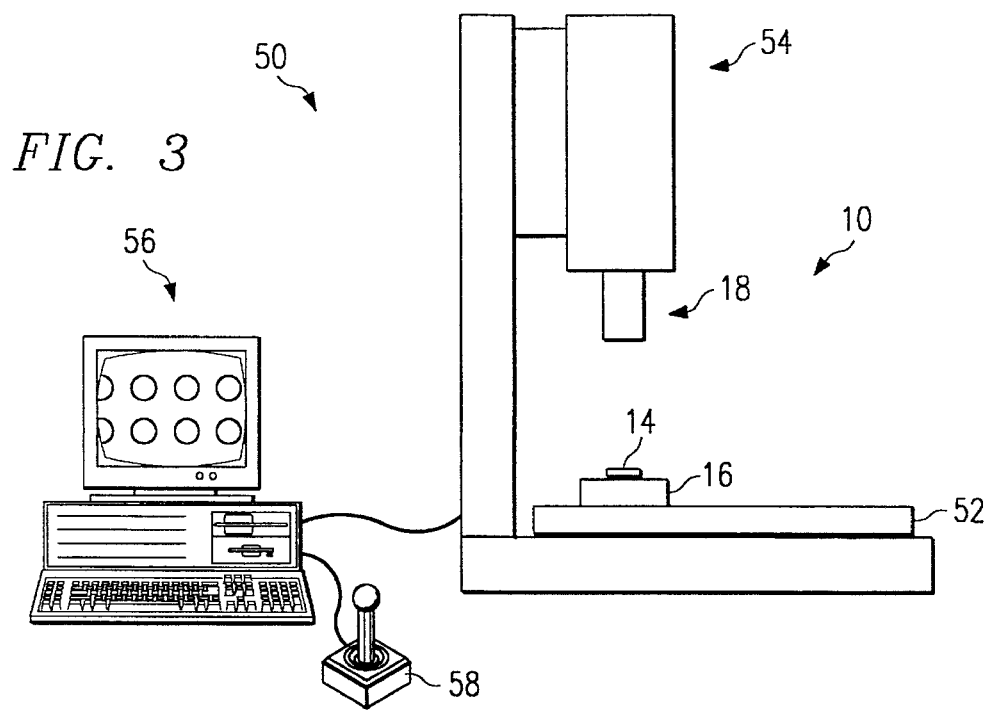
FIG. 3 is diagram of a video measuring system used in accordance with the teachings of the present invention.

Referring to FIG. 3, a simple diagram of a video measuring system 50 used to capture and display the image of the ball grid array is shown. The video measuring system 50 includes a stage 52, a video camera 54 with associated Z-direction travel and focusing mechanism, a computer workstation 56, and a joystick control 58. The stage 52 may be moved in the X and Y directions to achieve optimal positioning of the ball grid array 12 with respect to the light source/image capturer 18. The image captured by the video camera 54 may be displayed on the monitor for viewing by the operator. Commercially available video measuring systems such as the Smart Scope™ or the AVANT™ manufactured by Optical Gauging Products, Inc. of Rochester, N.Y. may be used. These Video measuring systems are capable of focusing on each solder ball and providing the X, Y, and Z measurements of each solder ball in the ball grid array 12.

Figure 4:
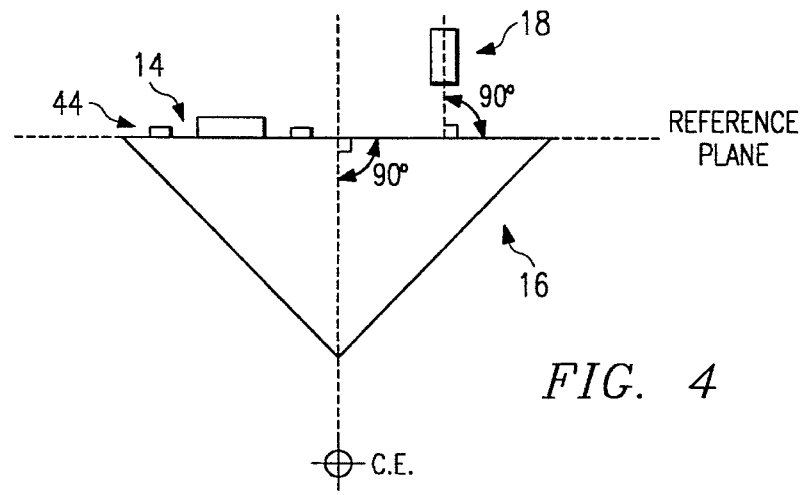
FIG. 4 is a simplified diagram showing alignment of the apparatus with respect to the center of earth and the alignment of the video system with respect to the apparatus.

As shown in FIG. 4, in operation, the optical assembly 16 is aligned with the center of the earth (C.E.) to ensure that the way the semiconductor device 14 sits on the transparent surface 30 is affected only by its weight distribution and not due to a skewing of the optical assembly 16. The transparent surface 30 or the reference plane 44 is thus aligned to be level with respect to the earth's center. This alignment step may be performed with any conventional tools such as a high resolution bubble level.

The image capturer 48 is also aligned with respect to the optical assembly 16, as shown in FIG. 4. The axis of the light emitted from the image capturer 18 and the image capturer 18 itself is aligned to be perpendicular to the transparent surface 30 or the reference plane 53 of the optical assembly 16. This alignment step ensures that the Z measurement of each solder ball in the ball grid array 12 is entirely attributed to the height of each ball and the weight distribution of the device, and not due to the skewing of the image capturer 18 with respect to the optical assembly 16. The alignment may be accomplished and verified by focusing on each of the reference plane datums, determining the Z measurement or range data of each datum, and comparing them. If the Z measurements of all the datums are equal, then the reference plane established by the datums is perpendicular to the image capturer 18.

Figure 5:
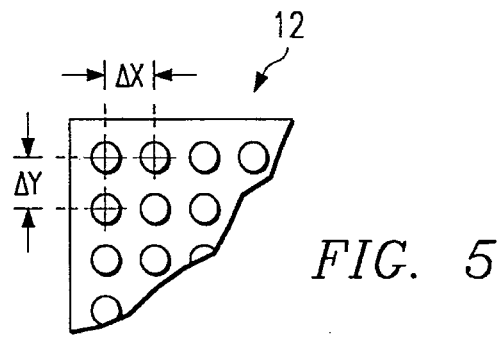
FIG. 5 is a top view of a portion of the solder balls of a ball grid array.
Figure 6:
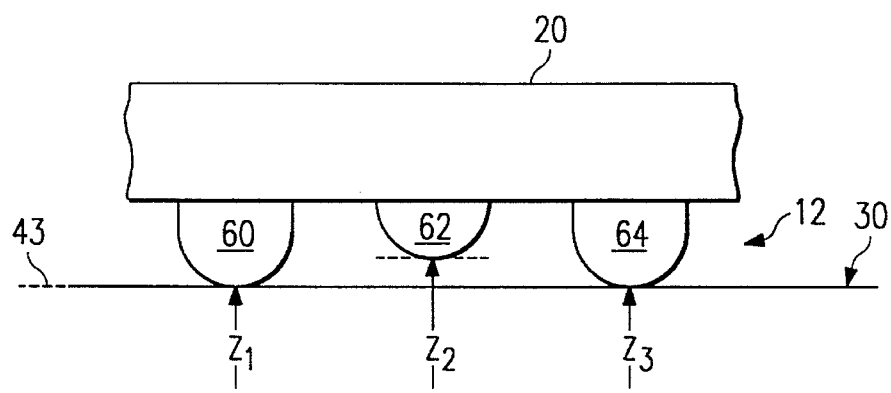
FIG. 6 is a side view of a portion of the solder balls showing ball height measurement.

Referring to FIGS. 5 and 6, the X, Y, and Z measurements of the solder balls are shown in more detail. The X and Y measurements provide the position of each solder ball as measured from a predetermined reference point, and the $\Delta X$ and $\Delta Y$ measurements are indicative of the spacing between the solder balls. The Z measurements or range data are indicative of the distance of the tips of each solder ball to a reference point established by the image capturer 48. More importantly, the Z measurements indicate whether the tips of the ball are in line with the transparent surface 30 the device 14 is resting on. The minimum Z measurement will yield the distance to the glass surface or the height data of those balls that are supporting the device. Those Z measurements more than the minimum may indicate a solder ball of insufficient height, which may not make a good connection when soldered to a circuit board. If the number of solder balls having the minimum Z measurement is a small minority of solder balls, then it may be possible that those balls have excess height and are the only solder balls supporting the device 14.

When using the video measuring systems 50 as discussed above, the focus information provided by the system is capable of providing the Z measurements or range data of the solder balls. Therefore, from the Z measurements of all the solder balls, the question of whether they are coplanar is easily answered. Alternatively, the video measuring system 50 may be programmed in accordance with the teachings of the present invention to automatically pinpoint those solder balls that may have excess height or insufficient height.

After the optical assembly 16 and the image capturer 18 are in alignment with respect to the earth's center as described above, the semiconductor device 14 is placed in a live bug mode on top of the optical assembly or light and image director 16. The operator then positions and aligns the light source/image capturer 18 and the stage 52 so that the video measurement system 50 focuses on each solder ball and obtains a range data or Z measurement for each. The Z measurements of all the solder balls in the ball grid array 12 are then compared to pinpoint those solder balls that fall short of the reference plane and to determine and verify the coplanarity of the solder balls.

In accordance with the teachings of the present invention, the semiconductor device may be placed in the live bug mode on a pane of transparent material such as glass or acrylic, and the light source/image capturer 18 may be positioned below the glass to obtain a top or head-on view the ball grid array. The Z measurements of the solder balls may be similarly obtained to determine and/or verify the coplanarity of the ball grid array.

Figure 7A:
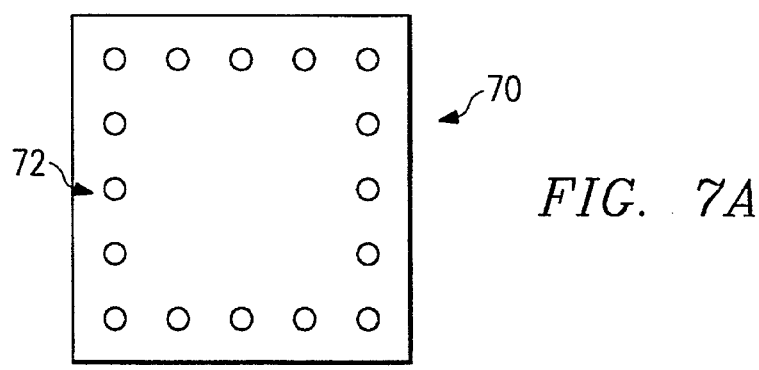
FIGS. 7a and 7b are top and side views, respectively, of an embodiment of a golden unit.
Figure 7B:
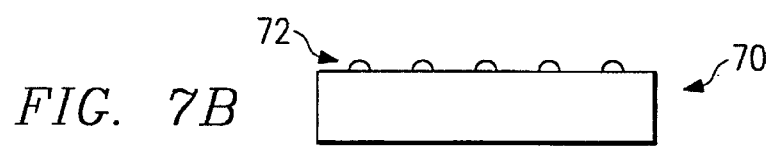

Referring to FIGS. 7a and 7b, an embodiment of a golden unit 70 used to verify the operations of the apparatus 10 is shown. The golden unit 70 is a mock-up of a semiconductor device with a perimeter solder ball formation 72 with known physical dimensions. The golden unit 70 may be constructed of a heat treated metal such as A2 or D2 tool steel so that it is relatively indestructive and made reflective by chrome plating, for example. The ball grid array 72 only has a single row of solder balls placed along the periphery of the golden unit 70 so that all solder balls are visible when viewed from the side. FIGS. 7a and 7b show an exemplary ball grid formation of five solder balls being visible from each side for a total of 16 solder balls. The spacing of the solder balls may approximate that of a typical ball grid array of a semiconductor device, which may be 0.2 inches. The solder balls approximate that of a ball grid array and may be hemispherical or spherical with a diameter of approximately 0.016 inches. The thickness of the golden unit 70 without taking into account of the ball height, may be approximately 0.25 inches.

Because all solder balls of the golden unit 70 are visible from the side, conventional live bug verification methods may be used to determine the coplanarity of the solder balls. The height of each solder ball may also be measured and recorded by conventional means and used to verify the accuracy of the apparatus 10. Therefore the apparatus 10 may be adjusted or aligned based on a comparison of the golden unit ball height information obtained by conventional means and by the teachings of the present invention.

Although the present invention and its advantages have been described in detail, it should be understood that various changes, substitutions and alterations can be made therein without departing from the spirit and scope of the invention as defined by the appended claims.

What is claimed is:

1. A method for verifying the coplanarity of a ball grid array having a plurality of solder balls on the underside of a semiconductor device package, comprising the steps of:

positioning the semiconductor device with the ball grid array down on a flat transparent surface;

positioning a light source and an image capturer generally above the semiconductor device;

directing light from said light source through the flat transparent surface to the ball grid array;

directing the image of the ball grid array through the flat transparent surface to said image capturer;

focusing said image capturer on each of said plurality of solder balls and generating a focus data for each solder ball; and determining the coplanarity of the ball grid array from said focus data.

2. The method, as set forth in claim 1, wherein said light and image directing steps include the step of reflecting the light and image with mirrored surfaces.

3. The method, as set forth in claim 1, further comprising the steps of perpendicularly aligning the light source and image capturer to the flat transparent surface.

4. The method, as set forth in claim 3, wherein said perpendicularly aligning step includes the steps of:

positioning at least three reference plane datums on the flat transparent surface;

focusing on each of the reference plane datums and generating a focus data for each datum; and comparing the focus data of the datums.

5. The method, as set forth in claim 1, wherein said light and image directing steps include the steps of:

providing a first mirrored surface at a 45° angle with respect to said flat transparent surface;

providing a second mirrored surface at a 135° angle with respect to the flat transparent surface; and positioning said light source so that the light therefrom is reflected by said first mirrored surface to said second mirrored surface and further reflected through said flat transparent surface to said ball grid array.

6. The method, as set forth in claim 5, further comprising the step of positioning said image capturer so that the image of said ball grid array is reflected by said second mirrored surface to said first mirrored surface to said image capturer.

7. The method, as set forth in claim 1, further comprising the step of verifying the accuracy of the step of determining the coplanarity by using a golden unit having known solder ball heights.

8. Apparatus for verifying the coplanarity of a plurality of solder balls of a ball grid array located on an underside of a semiconductor device, comprising:

an optical assembly having a flat transparent surface supporting said semiconductor device in a live bug mode;

a light source illuminating said ball grid array; and an image capturer having a focus mechanism generating focus data for each of said plurality of solder balls.

9. The apparatus, as set forth in claim 8, wherein said optical assembly further includes:

a first mirrored surface positioned at a 45° angle below said flat transparent surface; and a second mirrored surface positioned at a 135° angle below said flat transparent surface.

10. The apparatus, as set forth in claim 8, wherein said optical assembly includes:

a first prism having two transparent sides and a mirrored side;

a second prism having two transparent sides and a mirrored side; and said first and second prism being positioned to direct light from said light source to said ball grid array, and to direct image of said ball grid array to said image capturer.

11. The apparatus, as set forth in claim 8, further comprising a video measuring system.

12. The apparatus, as set forth in claim 8, further comprising a set of reflective reference plane datums positioned on said flat transparent surface about said semiconductor device used for aligning said image capturer with said optical assembly.

13. The apparatus, as set forth in claim 8, further comprising a golden unit having known solder ball heights used for verifying the accuracy of the apparatus.

* * * * *